United States Patent
Slack et al.

(10) Patent No.: US 8,088,220 B2
(45) Date of Patent: Jan. 3, 2012

(54) DEEP-EUTECTIC MELT GROWTH OF NITRIDE CRYSTALS

(75) Inventors: Glen A. Slack, Scotia, NY (US); Sandra B. Schujman, Niskayuna, NY (US)

(73) Assignee: Crystal IS, Inc., Green Island, NY (US)

( * ) Notice: Subject to any disclaimer, the term of this patent is extended or adjusted under 35 U.S.C. 154(b) by 800 days.

(21) Appl. No.: 12/126,334

(22) Filed: May 23, 2008

(65) Prior Publication Data

US 2009/0050050 A1   Feb. 26, 2009

Related U.S. Application Data

(60) Provisional application No. 60/931,683, filed on May 24, 2007.

(51) Int. Cl.
*C30B 19/00* (2006.01)
*C03B 19/06* (2006.01)

(52) U.S. Cl. ............. 117/67; 117/11; 117/54; 117/64; 117/73; 117/76; 117/77; 117/78; 117/81; 252/518.1

(58) Field of Classification Search ............. 117/11, 117/54, 64, 67, 73, 76, 77, 78, 81; 252/518.1
See application file for complete search history.

(56) References Cited

U.S. PATENT DOCUMENTS

| | | | |
|---|---|---|---|
| 3,531,245 A | 9/1970 | Dietz | |
| 3,600,701 A | 8/1971 | Gouldthorpe | |
| 3,603,414 A | 9/1971 | Stebley | |
| 3,607,014 A | 9/1971 | Huml et al. | |
| 3,634,149 A | 1/1972 | Knippenberg et al. | |
| 3,768,983 A | 10/1973 | Elkins et al. | |
| 3,903,357 A | 9/1975 | Woolfson et al. | |
| 3,933,573 A * | 1/1976 | Dugger | 117/78 |
| 4,008,851 A | 2/1977 | Hirsch | |
| 4,088,515 A | 5/1978 | Blakeslee et al. | |
| 4,234,554 A | 11/1980 | Rabenau et al. | |
| 4,547,471 A * | 10/1985 | Huseby et al. | 501/98.4 |
| 5,087,949 A | 2/1992 | Haitz | |
| 5,292,487 A | 3/1994 | Tatsumi et al. | |
| 5,494,861 A | 2/1996 | Yamaga et al. | |
| 5,520,785 A | 5/1996 | Evans et al. | |
| 5,525,320 A | 6/1996 | Pratsinis et al. | |
| 5,670,798 A | 9/1997 | Schetzina | |
| 5,858,085 A | 1/1999 | Arai et al. | |
| 5,858,086 A | 1/1999 | Hunter | |

(Continued)

FOREIGN PATENT DOCUMENTS

EP   0 609 799 A2   8/1994

(Continued)

OTHER PUBLICATIONS

Lawson, et al. "Preparation of Single Crystals," Academic Press, New York, pp. 18-20 (1958).*

(Continued)

*Primary Examiner* — Michael Kornakov
*Assistant Examiner* — Kenneth A Bratland, Jr.
(74) *Attorney, Agent, or Firm* — Bingham McCutchen LLP

(57) ABSTRACT

In accordance with various embodiments, crystalline structures are formed by providing, at a growth temperature, a liquid comprising AlN and having a quality factor greater than approximately 0.14 and forming solid AlN from the liquid, the growth temperature being lower than the melting point of AlN.

23 Claims, 3 Drawing Sheets

U.S. PATENT DOCUMENTS

| | | | |
|---|---|---|---|
| 5,868,837 A | 2/1999 | DiSalvo et al. | |
| 5,909,036 A | 6/1999 | Tanaka et al. | |
| 5,924,874 A | 7/1999 | Gotoh et al. | |
| 5,954,874 A | 9/1999 | Hunter | |
| 5,972,109 A | 10/1999 | Hunter | |
| 5,981,980 A | 11/1999 | Miyajima et al. | |
| 6,000,174 A | 12/1999 | Yamazaki et al. | |
| 6,001,748 A | 12/1999 | Tanaka et al. | |
| 6,006,620 A | 12/1999 | Lawrie et al. | |
| 6,045,612 A | 4/2000 | Hunter | |
| 6,048,813 A | 4/2000 | Hunter | |
| 6,063,185 A | 5/2000 | Hunter | |
| 6,066,205 A * | 5/2000 | Hunter | 117/200 |
| 6,086,672 A | 7/2000 | Hunter | |
| 6,091,085 A | 7/2000 | Lester | |
| 6,187,089 B1 | 2/2001 | Phillips et al. | |
| 6,211,089 B1 | 4/2001 | Kim et al. | |
| 6,270,569 B1 | 8/2001 | Shibata et al. | |
| 6,296,956 B1 | 10/2001 | Hunter | |
| 6,398,867 B1 | 6/2002 | D'Evelyn et al. | |
| 6,404,125 B1 | 6/2002 | Garbuzov et al. | |
| 6,447,604 B1 | 9/2002 | Flynn et al. | |
| 6,468,347 B1 | 10/2002 | Motoki et al. | |
| 6,515,308 B1 | 2/2003 | Kneissl et al. | |
| 6,592,663 B1 | 7/2003 | Sarayama et al. | |
| 6,596,079 B1 | 7/2003 | Vaudo et al. | |
| 6,719,843 B2 | 4/2004 | Schowalter et al. | |
| 6,770,135 B2 | 8/2004 | Schowalter et al. | |
| 6,777,717 B1 | 8/2004 | Karlicek | |
| 6,791,119 B2 | 9/2004 | Slater, Jr. et al. | |
| 6,831,302 B2 | 12/2004 | Erchak et al. | |
| 6,840,431 B1 | 1/2005 | Kim | |
| 6,936,357 B2 | 8/2005 | Melnik et al. | |
| 6,995,402 B2 | 2/2006 | Ludowise et al. | |
| 7,026,659 B2 | 4/2006 | Slater, Jr. et al. | |
| 7,037,738 B2 | 5/2006 | Sugiyama et al. | |
| 7,037,838 B2 | 5/2006 | Schowalter et al. | |
| 7,056,383 B2 | 6/2006 | Helava et al. | |
| 7,063,741 B2 | 6/2006 | D'Evelyn et al. | |
| 7,087,112 B1 | 8/2006 | Rojo et al. | |
| 7,125,734 B2 | 10/2006 | Sackrison et al. | |
| 7,186,580 B2 | 3/2007 | Tran et al. | |
| 7,211,146 B2 | 5/2007 | Schowalter et al. | |
| 7,211,831 B2 | 5/2007 | Erchak et al. | |
| 7,250,637 B2 | 7/2007 | Shimizu et al. | |
| 7,274,043 B2 | 9/2007 | Erchak et al. | |
| 7,288,152 B2 | 10/2007 | Kitaoka et al. | |
| 7,420,218 B2 | 9/2008 | Nagai | |
| 7,420,222 B2 | 9/2008 | Slater, Jr. et al. | |
| 7,439,552 B2 | 10/2008 | Takigawa et al. | |
| 7,476,910 B2 | 1/2009 | Fujimoto et al. | |
| 7,518,158 B2 | 4/2009 | Keller et al. | |
| 7,554,128 B2 | 6/2009 | Okamoto et al. | |
| 7,631,986 B2 | 12/2009 | Harrah | |
| 7,638,346 B2 | 12/2009 | Schowalter et al. | |
| 7,641,735 B2 | 1/2010 | Slack et al. | |
| 7,678,195 B2 * | 3/2010 | Schlesser et al. | 117/94 |
| 7,776,153 B2 | 8/2010 | Schowalter | |
| 2001/0000209 A1 | 4/2001 | Krames et al. | |
| 2001/0024871 A1 | 9/2001 | Yagi | |
| 2001/0051433 A1 | 12/2001 | Francis et al. | |
| 2002/0170490 A1 | 11/2002 | Vodakov et al. | |
| 2003/0047816 A1 | 3/2003 | Dutta | |
| 2003/0160254 A1 | 8/2003 | Henrichs | |
| 2003/0168003 A1 * | 9/2003 | Schowalter et al. | 117/106 |
| 2003/0213964 A1 | 11/2003 | Flynn | |
| 2003/0216011 A1 | 11/2003 | Nakamura et al. | |
| 2004/0033690 A1 | 2/2004 | Schowalter et al. | |
| 2004/0130002 A1 | 7/2004 | Weeks et al. | |
| 2004/0187766 A1 | 9/2004 | Letertre | |
| 2004/0206978 A1 | 10/2004 | Saxler | |
| 2004/0213309 A9 | 10/2004 | Amano et al. | |
| 2004/0224484 A1 | 11/2004 | Fareed et al. | |
| 2004/0226917 A1 | 11/2004 | Laconto et al. | |
| 2004/0245535 A1 | 12/2004 | D'Evelyn et al. | |
| 2005/0072986 A1 | 4/2005 | Sasaoka | |
| 2005/0103257 A1 | 5/2005 | Xu et al. | |
| 2005/0142391 A1 | 6/2005 | Dmitriev et al. | |
| 2005/0161697 A1 | 7/2005 | Nakahata et al. | |
| 2005/0214992 A1 | 9/2005 | Chakraborty et al. | |
| 2005/0269577 A1 | 12/2005 | Ueda et al. | |
| 2005/0277214 A1 * | 12/2005 | Uematsu et al. | 438/22 |
| 2005/0285141 A1 | 12/2005 | Piner et al. | |
| 2006/0005763 A1 | 1/2006 | Schowalter et al. | |
| 2006/0029832 A1 | 2/2006 | Xu et al. | |
| 2006/0054075 A1 | 3/2006 | Dwilinski et al. | |
| 2006/0244011 A1 | 11/2006 | Saxler | |
| 2006/0255341 A1 | 11/2006 | Pinnington et al. | |
| 2006/0281205 A1 | 12/2006 | Park | |
| 2006/0288929 A1 | 12/2006 | Slack et al. | |
| 2007/0018184 A1 | 1/2007 | Beeson et al. | |
| 2007/0101932 A1 | 5/2007 | Schowalter et al. | |
| 2007/0102721 A1 | 5/2007 | DenBaars et al. | |
| 2007/0131160 A1 | 6/2007 | Slack et al. | |
| 2007/0134827 A1 | 6/2007 | Bondokov et al. | |
| 2007/0243653 A1 | 10/2007 | Morgan et al. | |
| 2007/0257333 A1 | 11/2007 | Schlesser et al. | |
| 2008/0012034 A1 | 1/2008 | Thielen et al. | |
| 2008/0036038 A1 | 2/2008 | Hersee et al. | |
| 2008/0054280 A1 | 3/2008 | Reginelli et al. | |
| 2008/0121910 A1 | 5/2008 | Bergmann et al. | |
| 2008/0135861 A1 | 6/2008 | Pokrovskiy et al. | |
| 2008/0142817 A1 | 6/2008 | Ibbetson et al. | |
| 2008/0144688 A1 | 6/2008 | Chua et al. | |
| 2008/0149945 A1 | 6/2008 | Nagai | |
| 2008/0149960 A1 | 6/2008 | Amo et al. | |
| 2008/0157111 A1 | 7/2008 | Erchak et al. | |
| 2008/0173887 A1 | 7/2008 | Baba et al. | |
| 2008/0182092 A1 | 7/2008 | Bondokov et al. | |
| 2008/0187016 A1 | 8/2008 | Schowalter et al. | |
| 2008/0191225 A1 | 8/2008 | Medendorp | |
| 2008/0251808 A1 | 10/2008 | Kususe et al. | |
| 2008/0258165 A1 | 10/2008 | Zimmerman et al. | |
| 2009/0008654 A1 | 1/2009 | Nagai | |
| 2009/0014742 A1 | 1/2009 | Erchak | |
| 2009/0039373 A1 | 2/2009 | Saito et al. | |
| 2009/0065791 A1 | 3/2009 | Yen et al. | |
| 2009/0078957 A1 | 3/2009 | Hoshina | |
| 2009/0121246 A1 | 5/2009 | Denbaars et al. | |
| 2009/0121250 A1 | 5/2009 | DenBaars et al. | |
| 2009/0140279 A1 | 6/2009 | Zimmerman et al. | |
| 2009/0141502 A1 | 6/2009 | Sonoda et al. | |
| 2009/0155989 A1 | 6/2009 | Uematsu et al. | |
| 2009/0159910 A1 | 6/2009 | Lin et al. | |
| 2009/0166657 A1 | 7/2009 | Yamada et al. | |
| 2009/0173958 A1 | 7/2009 | Chakraborty et al. | |
| 2009/0233394 A1 | 9/2009 | Batres et al. | |
| 2009/0256163 A1 | 10/2009 | Chakraborty | |
| 2009/0261372 A1 | 10/2009 | Ueda | |
| 2009/0267098 A1 | 10/2009 | Choi | |
| 2009/0278148 A1 | 11/2009 | Nabekura et al. | |
| 2009/0315054 A1 | 12/2009 | Kim et al. | |
| 2009/0321758 A1 | 12/2009 | Liu et al. | |
| 2009/0321771 A1 | 12/2009 | Hattori et al. | |
| 2010/0006870 A1 | 1/2010 | Lee et al. | |
| 2010/0012956 A1 | 1/2010 | Yoo | |
| 2010/0025717 A1 | 2/2010 | Fujii et al. | |
| 2010/0025719 A1 | 2/2010 | Li | |
| 2010/0135349 A1 | 6/2010 | Schowalter et al. | |
| 2010/0187541 A1 | 7/2010 | Slack et al. | |
| 2010/0264460 A1 | 10/2010 | Grandusky et al. | |
| 2010/0314551 A1 | 12/2010 | Bettles et al. | |
| 2011/0008621 A1 | 1/2011 | Morgan et al. | |
| 2011/0011332 A1 | 1/2011 | Rojo et al. | |

FOREIGN PATENT DOCUMENTS

| | | |
|---|---|---|
| EP | 0 811 708 | 12/1997 |
| EP | 0 979 883 | 2/2000 |
| EP | 1 211 715 | 6/2002 |
| EP | 1 732 145 A2 | 12/2006 |
| EP | 1 754 810 A1 | 2/2007 |
| JP | 03-285075 | 12/1991 |
| JP | 04-355920 A | 12/1992 |
| JP | 2001-192647 | 7/2001 |
| WO | WO-99/34037 A1 | 7/1999 |
| WO | WO-01/011116 A1 | 2/2001 |
| WO | WO-03-007383 | 1/2003 |

| | | | |
|---|---|---|---|
| WO | WO-03-081730 A2 | 10/2003 | |
| WO | WO-2005-012602 A1 | 2/2005 | |
| WO | WO-2006/115012 A1 | 10/2006 | |
| WO | WO-2007-062250 A2 | 5/2007 | |
| WO | WO-2008-042020 A2 | 4/2008 | |

OTHER PUBLICATIONS

Atobe—JJAP, 29, 150, 1990—F-Type Centers in Neutron-Irradiated AlN.
Bradley—JVacSciTechB 21, 2558, 2003—Deep level defects and doping in high Al mole fraction AlGaN.
Freitas—pssb 240, 330, 2003—Shallow donors in GaN.
Hossain—SPIE 2877, 42, 1996—Study of CL spectroscopy of AlN.
Klemens—PhysB, 316-317,413, 2002—Effect of point defects on the decay of the longitudinal optical mode.
Morita—JJAP 21, 1102, 1982—Optical absorption and CL of epitaxial AlN films.
Nepal—APL 89, 092107, 2006—Photoluminescene studies of impurity transitions in AlGaN alloys.
Salzman—pssc 0, 2541, 2003—Reduction of oxygen contamination in AlN.
Shi—APL89, 163127, 2006—Luminescence properties of AlN nanotips.
Katayama-Yoshida et al., "Codoping method for the Fabrication of Low-Resistivity Wide Band-Gap Semiconductors in p-type GaN, p-type AlN and n-type Diamond: Prediction versus Experiment," 13 J. of Physics: Condensed Matter, pp. 8901-8914 (2001).
Office Action in Australian Patent Application No. 2003303485, Oct. 9, 2008, 2 pages.
Office Action in Canadian Patent Application No. 2,467,806, Aug. 13, 2009, 4 pages.
Office Action in Canadian Patent Application No. 2,467,806, Feb. 23, 2010, 2 pages.
Office Action in European Patent Application No. 02803675.4, May 2, 2007, 4 pages.
Office Action in European Patent Application No. 02806723.9, Feb. 7, 2007, 4 pages.
Office Action in European Patent Application No. 02806723.9, Jan. 17, 2008, 4 pages.
Office Action in European Patent Application No. 02806723.9, dated Feb. 16, 2010 (2 pages).
Office Action in European Patent Application No. 03808366.3, dated Sep. 28, 2006, 4 pages.
Office Action in European Patent Application No. 06844804.2, Mar. 4, 2009, 3 pages.
Office Action in Japanese Patent Application No. 2003-579324, Sep. 8, 2009, 1 p.
Office Action in Japanese Patent Application No. 2003-545445, mailed Nov. 10, 2009, 3 pages.
Office Action in Japanese Patent Application No. 2003-545445, mailed Sep. 30, 2008, 3 pages.
Office Action in Japanese Patent Application No. 2004-564684, Jun. 24, 2009, 2 pages.
Office Action in Japanese Patent Application No. 2004-564684, Feb. 3, 2010, 2 pages.
Office Action in Taiwan Patent Application No. 91137050, Apr. 6, 2004, 1 page.
Summons to Attend Oral Proceedings in European Patent Application No. 03808366.3, Dec. 17, 2007, 5 pages.
Wongchotigul et al., "Low Resistivity Aluminum Nitride:Carbon (AlN:C) Films Grown by Metal Organic Chemical Vapor Deposition," 26 Materials Letters, pp. 223-226 (Mar. 1996).
Barin, "Thermochemical data of Pure Substances", VCH Verlagsgesellschaft mbH, Weinheim, Germany, 2nd Ed. (1993).
Bickermann et al., "Characterization of bulk AlN with low oxygen content", J. Cryst. Growth, 269 (2004) 432.
Constantin et al., "Mixing rocksalt and wurtzite structure binary nitrides to form novel ternary alloys: ScGaN and MnGaN", Mat. Res. Soc. Symp. Proc., 799 (2004) Z9.5.1.
DeVries et al., "Phase equilibria pertinent to the growth of cubic boron nitride", J. Cryst Growth, 13/14 (1972) 88.

Dugger, "The single crystal synthesis and some properties of Aluminum Nitride", Air Force Cambridge Research Laboratories, Physical Science Research Papers, No. 656 (Aug. 1, 1975).
Dugger, "The synthesis of Aluminum Nitride single crystals", Mat. Res. Bulletin, 9 (1974) 331.
Karel et al., "The luminescence properties of AlN with Manganese and rare earth activators under ultraviolet and cathode-ray excitation", Czech. J. Phys., B20 (1970) 46.
Karpinski et al., "Equilibrium pressure of $N_2$ over GaN and high pressure solution growth of GaN", J. Cryst. Growth, 66 (1984) 1.
Kawabe et al., "Electrical and optical properties of AlN—a thermostable semiconductor", Electrical Engineering in Japan, 87 (1967) 62.
Kordis, "The BeO-MgO system", J. Nuc. Mater., 14 (1964) 322.
Lawson et al., "Preparation of Single Crystals", Academic Press, New York (1958) pp. 18-20.
Nakanishi et al., "Effects of Al Composition on luminescence properties of europim implanted $Al_xGa_{1-x}N$ ($0 \angle x \angle 1$)", Phys. Stat. Sol. (c), 0 (2003) 2623.
Niewa et al., "Li3[ScN2]: The first nitridoscandate (III)—Tetrahedral Sc Coordination and unusual $MX_2$ framework", Chem. Eur. J., 9 (2003) 4255.
Niewa et al., "Recent developments in nitride chemistry", Chem. Mater., 10 (1998) 2733.
Slack et al., "Growth of high purity AlN crystals", J. Cryst. Growth, 34 (1976) 263.
Sun et al., "Phase relationships in the system Y-Al-O-N", Mater. Letters, 3-4 (1991) 67.
Taniyasu et al., "An aluminum nitride ligth-emitting diode with a wavelength of 210 nanometres", Nature, 441 (2006) 325.
Taniyasu et al., "Intentional control of n-type conduction for Si-doped AlN and $Al_xGa_{1-x}N$ (0.42 $\angle x \angle$ 1)", Applied Physics Letters, 81 (2002) 1255.
Vendl et al., "The melting points of some rare-earth metal nitrides as function of the nitrogen pressure", High Temperatures—High Pressures, 9 (1977) 313.
Wentorf Jr., "Synthesis of the cubic form of boron nitride", J. Chem. Phys., 34 (1961) 809.
Yamane et al., "Preparation of GaN single crystals using a Na flux", Chem. Mater., 9 (1997).
Yano et al., "Growth of nitride crystals, BN, AlN and GaN by using a Na flux" Diamond and Related Materials, 9, (2000) 512.
International Preliminary Report on Patentability and Written Opinion for PCT.US2008/000597, mailed Jul. 30, 2009.
International Preliminary Report on Patentabiliy and Written Opinion for PCT/US2008/001003, mailed Aug. 6, 2009.
Arulkumaran et al., "Improved dc characteristics of AlGaN/GaN high-electron-mobility transistors on AlN/sapphire templates," (2002) Applied Physics Letters, vol. 81, No. 6, pp. 1131-1133.
Balkas et al., "Sublimation Growth and Characterizations of Bulk Aluminum Nitride Single Crystals," J. Crystal Growth, (1997) 179, p. 363.
Bockowski et al., "Combustion Synthesis of Aluminum Nitride Under High Pressure of Nitrogen and Nitrogen-Argon Mixtures," 5 J. Mat. Synthesis & Processing 6, (1997) pp. 449-458.
Bolgar et al., "Vaporization of the Nitirides of B, Al, and Ga," in Khim Fiz. Nitrodov, pp. 151-156 (1968) [Chem Abstr. 71, 34003j (1969)].
Chase, J. Phys. Chem., Ref. Data, Monograph No. 9, NIST-JANAF Thermochemical Tables, 4th Ed. (1998).
Chitnis et al., "Milliwatt Power AlGaN Quantum Well Deep Ultraviolet Light Emitting Diodes," Phys. Sat. Sol. (a), (2003) vol. 200, No. 1, pp. 99-101.
Cox et al., "On the Preparation, Optical Properties and Electrical Behaviour of Aluminum Nitride," J. Phys. Chem. Solids, (1967) vol. 28, pp. 543-548.
Dalmau et al., Mat. Res. Soc. Proc., (2004) vol. 798, p. Y2.9.1.
Dryburgh, "The Estimation of Maximum Growth Rate for Aluminum Nitride Crystals by Direct Sublimation," J. Crystal Growth, (1992) 125, pp. 65-68.
Epelbaum et al., "Sublimation growth of bulk AlN crystals: materials compatibility and crystal quality," Mat. Sci. Forum, (2002) 389-393, 1445.

Gorbatov et al., "Electrical Conductivity of Materials from Mixed Aluminum and Silicon Nitrides," *Sov. Powd. Met. Met. Ceram.*, (1970) vol. 9, pp. 917-920.
Hacke et al., "Photoluminescence Intensity and Spectral Distribution of GaN Films on SiC," (1999) *Phys. Stat. Sol. (b)*, 216, 639.
Hermann et al., "Highly Si-doped AlN Grown by Plasma-Assisted Molecular-Beam Epitaxy," *Applied Phys. Letters*, (2005) vol. 86, p•. 192108-1-192108-3.
International Preliminary Report on Patentability and Written Opinion for PCT/US2006/045540, mailed Jun. 12, 2008.
International Preliminary Report on Patentability and Written Opinion for PCT/US2006/046300, mailed Jun. 12, 2006.
International Search Report and Written Opinion for PCT/US2007/011075, mailed Jul. 11, 2008.
International Search Report and Written Opinion for PCT/US2007/07980, mailed Oct. 12, 2007.
International Search Report and Written Opinion for PCT/US2008/000597, mailed May 20, 2008.
International Search Report and Written Opinion for PCT/US2008/001003, mailed Aug. 5, 2008.
International Search Report for PCT/US2006/022329, mailed Dec. 12, 2006.
International Search Report for PCT/US2006/045540, mailed Jul. 6, 2007.
International Search Report for PCT/US2006/046300, mailed May 30, 2007.
Jahnen et al., "Pinholes, Dislocations and Strain Relaxation in InGaN," *MRS Internet J. Nitride Semicond. Res.*, (1998) 3:39.
Kanechika et al., "n-type AlN Layer by Si Ion Implantation," *Applied Phys. Letters*, (2006) vol. 88, p. 202106.
Karpov et al., "Sublimation Growth of AlN in Vacuum and in a Gas Atmosphere," *Phys. Stat. Sol. (a)*, (1999) 179, p. 435.
Kasu et al., "Formation of Solid Solution of Al1-xSixN (0<x?12%) Ternary Alloy," *Jap. J. Appl. Phys.*, (2001) vol. 40, Part 2, No. 10A, pp. L1048-L1050.
Liu et al., "A Global Growth Rate Model for Aluminum Nitride Sublimation," *J. Electrochemical. Soc.*, (2002) 149, p. G12.
Liu et al., "Characterization of AlN Crystals Grown by Sublimation," *Phys. Stat. Sol.* (a), (2001) 188, p. 769.
Liu et al., "Misfit Dislocation Generation in InGaN Epilayers on Free-Standing GaN," *Jap. J. Appl. Physics*, (2006) 46:22, pp. L549-L551.
Matthews et al., "Defects in Epitaxial Multilayers," *J. Crystal Growth*, (1974) 27, p. 118.
Mokhov et al., "Sublimation growth of AlN bulk crystals in Ta crucibles," *Jrl. of Crys. Growth*, (Jul. 15, 2005) vol. 281, No. 1, pp. 93-100.
Naidu et al., Eds. "Phase Diagrams of Binary Tungsten Alloys," Indian Institute of Metals, Calcutta, pp. 7-13 (1991).
Nassau et al., "The Physics and Chemistry of Color," Wiley-Interscience Publication (New York 1983).
Noveski et al., "Growth of AlN Crystals on AlN/SiC Seeds by AlN Powder Sublimation in Nitrogen Atmosphere," *MRS Internet J. Nitride Semicond. Res.*, (2004) 9, 2.
Noveski et al., "Mass Transfer in AlN Crystal Growth at High Temperatures " *J. Crystal Growth*, (2004) 264, pp. 369-378.
Office Action in Japanese Patent Application No. 2003-579324, May 27, 2008.
Parker et al., "Determination of the critical layer thickness in the InGaN/GaN heterostructures," *Applied Phys. Letters*. (1999) vol. 75, No. 18, pp. 2776-2778.
Proc. of NATO Advanced Study Inst. on Nitrogen Ceramics, University of Kent, Canterbury, U.K. (1976).
Raghothamachar et al., "Synchrotron White Beam Topography Characterization of Physical Vapor Transport Grown AlN and Ammonothermal GaN," *J. Crystal Growth*, (2002) 246, pp. 271-280.

Raghothamachar et al., "X-ray Characterization of Bulk AlN Single Crystals Grown by the Sublimation Technique," *J. Crystal Growth*, (2003) 250(1-2), pp. 244-250.
Rojo et al., "Growth and Characterization of Epitaxial Layers on Aluminum Nitride Substrates Prepared from Bulk, Single Crystals," *J. Crystal Growth*, (2002) 240, p. 508.
Rojo et al., "Progress in the Preparation of Aluminum Nitride Substrates from Bulk Cystals," *Mat.Res. Soc. Symp. Pro.*, (2002) vol. 722, pp. 5-13.
Rojo et al., "Report on the Growth of Bulk Aluminum Nitride and Subsequent Substrate Preparation," *J. Crystal Growth*, (2001) 231, p. 317.
Schlesser et al., "Growth of AlN Bulk Crystals from the Vapor Phase," *Mat. Res. Soc. Symp. Proc.*, (2002) 693, p. 19.4.1.
Schowalter et al., "Fabrication of Native, Single-Crystal AlN Substrates," *Phys. Stat. Sol. (c)*, (2003) 1-4.
Segal et al., "On Mechanisms of Sublimination Growth of AlN bulk Crystals," *J. Crystal Gowth*, (2000) 211, pp. 68-72.
Shih et al, "High-quality and crack-free $Al_xGa_{1-x}N$ (x-0.2) grown on sapphire by a two-step growth method," *Jrl. of Crys. Growth*, (Apr. 15, 2005) vol. 277, No. 1-4, pp. 44-50.
Silveira et al., "Excitonic Structure of Bulk AlN from Optical Reflectivity and Cathodoluminescense Measurements," *Phys. Review* B71, 041201® (2006).
Singh et al., "Physical Vapor Transport Growth of Large AlN Crystals," *J. Cryst. Growth*, (2003) 250, p. 107.
Slack et al., "AlN Single Crystals," *J. Crystal Growth*, (1977) 42, pp. 560-563.
Slack et al., "Properties of Crucible Materials for Bulk Growth of AlN," *Mat. Res. Soc. Proc.*, (2004) vol. 798, pp. Y10.74.1-Y10.74.4.
Slack et al., "Some Effects of Oxygen Impurities on AlN and GaN," *J. Crystal Growth* (2002) 246, pp. 287-298.
Smart et al., "AlGaN/GaN Heterostructures on Insulating AlGaN Nucleation Layers," *Appl. Phys. Letters*, (1999) 75, p. 388.
Solid State Lighting Report (Dept. of Energy, 2007).
Song, "Strain relaxation due to V-pit formation in InxGa1-xN/GaN epilayers grown on sapphire," *J. Applied Phys.*, (2005) 98: 084906.
Takeuchi et al., "Optical Properties of Strained AlGaN and GaInN on GaN," *Jap. J. Appl. Phys.*, (1997) vol. 36, pp. L177-L179.
Takeya et al., "Degradation in AlGaInN Lasers," *Phys. Stat. Sol. (c)*, (2003) 0, No. 7, pp. 2292-2295.
Tavernier et al., "Chemical Mechanical Polishing of Gallium Nitride," *Electrochemical and Solid State Latters* (2002) vol. 5, No. 8, pp. G61-G64.
Tomiya et al., "Dislocations in GaN-Based Laser Diodes on Epitaxial Lateral Overgrown GaN Layers," *Phys. Stat. Sol. (a)*, (2001) vol. 188, No. 1, pp. 69-72.
Tsao, "Solid-State Lighting: Lamps, Chips and Materials for Tomorrow," *IEEE Circuits and Devices Magazine*, (2004) 20, pp. 28-37.
Van de Walle et al., "Doping of AlGaN Alloys," *MRS Internet J. Nitride Semicond. Res.*, (1999) 4S1, G10.4, pp. 1-12.
Van de Walle et al., "DX-center Formation in Wurtzite and Zincblende AlxGa1-xN," *Phys. Rev.*, (1998) B57, R2033.
Venugopal et al., "Comparison of Various Buffer Schemes to Grow GaN on Large-Area Si(111) Substrates Using Metal-Organic Chemical-Vapor Deposition," *32 J. Electronic Mat.*, vol. 32, No. 5 (2003) pp. 371-374.
Vinogradov et al., "Determination of the Melting Parameters of Aluminum Nitride," *High Temperatures—High Pressures*, (1991) 23:685.
Zeisel et al., "DX-behavior of Si in AlN," Phys. Rev., (2000) B61, R16283.
Zhuang et al., "Seeded growth of AlN single crystals by physical vapor transport," *Jrl. of Crys. Growth*, (Jan. 25, 2006), vol. 287, No. 2, pp. 372-375.

\* cited by examiner

DEEP-EUTECTIC MELT GROWTH OF NITRIDE CRYSTALS

RELATED APPLICATIONS

This application claims the benefit of and priority to U.S. Provisional Application Ser. No. 60/931,683, filed May 24, 2007, the entire disclosure of which is hereby incorporated by reference.

GOVERNMENT SUPPORT

This invention was made with United States Government support under 70NANB4H3051 awarded by the National Institute of Standards and Technology. The United States Government has certain rights in the invention.

FIELD OF THE INVENTION

The technology disclosed herein relates generally to fabrication of semiconductor single crystals, in particular the growth of nitride semiconductor single crystals from a molten solution.

BACKGROUND

The interest in nitrides of the group-III metals such as gallium (Ga), indium (In) and aluminum (Al) has risen during the past decade because of their potential as high-frequency/high-power electronic materials and blue, violet and ultraviolet optoelectronic materials for devices such as light-emitting diodes (LEDs), laser diodes (LDs), and photo detectors. Such devices include active areas consisting of layers composed of solid solutions of, e.g., gallium nitride (GaN), indium nitride (InN), and/or aluminum nitride (AlN) in various proportions. In various devices, some or all of the layers are doped with one or more impurity species, e.g., n-type or p-type dopants. The layers are typically epitaxially grown on a substrate that provides the template for the ordering of the atoms in the layers. The layers may be lattice-matched to the substrate, i.e., have an atomic spacing (or lattice parameter) closely or identically matched to that of the substrate, in order to avoid the formation of crystalline defects, such as dislocations, that may negatively affect the performance of the devices.

Several types of materials may be used to fabricate substrates for nitride-based semiconductor heterostructures. For devices employing GaN or $Ga_{1-x}In_xN$ (herein interchangeably referred to as InGaN or GaInN), a highly desirable substrate would be a large-area GaN single-crystal wafer. While several methods to grow GaN crystals have been proposed, none of them appears to be commercially feasible to fabricate large-area bulk crystals of GaN. Sapphire is a popular conventional substrate material because relatively high-quality, inexpensive sapphire substrates are commercially available. However, for a number of reasons, sapphire is not particularly suited for GaN epitaxy. Single-crystal substrates of silicon carbide (SiC) present an attractive alternative to sapphire due to their close lattice match to AlN/GaN in the plane perpendicular to the c-axis (i.e., the "c-plane") and their high thermal conductivity. In addition, SiC substrates can be made electrically conducting, which is attractive for some applications, including fabrication of LEDs and LDs. However, wurtzite SiC (matching the wurtzite crystal structure of GaN) is not available and the lattice mismatch along the c-axis between GaN and both 4H and 6H SiC is substantial. In addition, the chemical bonding between the group IV elements of the SiC and the group III or group V elements of the nitrides may deleteriously create nucleation problems leading to electronic states at the interface.

Alternative substrates for commercial fabrication of nitride-based devices are necessary to mitigate the above-described limitations of sapphire and SiC substrates. Specifically, the physical and electronic properties of AlN—its wide energy band gap, high-breakdown electric field, extremely high thermal conductivity, and low optical absorption in the visible and ultraviolet spectra—make this material desirable for a wide variety of semiconductor applications as a substrate material. In addition, both SiC and sapphire have a large thermal-expansion mismatch with GaN between room temperature and typical temperatures used for epitaxy of the nitrides (approximately 1100° C. or higher), while AlN and GaN are very well thermally matched over this same temperature range.

AlN is particularly well-suited as a substrate material not only for GaN and InGaN, but also for epitaxial growth of III-nitride-based devices for optoelectronics and radio-frequency (RF) applications where a high Al content is desirable. The AlN lattice mismatch to $Al_xGa_{1-x}N$ (where $0<x<1$, herein interchangeably referred to as AlGaN) alloys varies from a maximum of 2.3% to pure GaN and decreases for increasing Al concentration. Low dislocation densities may be preferable for the fabrication of devices such as deep ultraviolet (UV) LDs and high-efficiency deep-UV LEDs. Bulk AlN is typically highly insulating, which may be useful for high-power RF applications. Native AlN substrates may also be advantageously fabricated with various crystalline orientations, e.g., non-polar orientations or specific misorientations, which are unobtainable with other substrates such as sapphire or SiC.

Recently, fabrication of AlN crystals having very low dislocation densities has been demonstrated by the sublimation-recondensation method described in, e.g., commonly-owned co-pending U.S. patent application Ser. No. 11/503,660 (the "'660 application"), the entire disclosure of which is hereby incorporated by reference. While the sublimation-recondensation method is extremely useful in the growth of pure, high-quality, large-diameter crystals of AlN, the material is usually insulating. For some applications, doped semiconducting material is advantageous, and growth of doped crystals from a melt may be easier because applying a nitrogen overpressure in the melt vessel may maintain the doping elements mixed in the molten AlN solution. In the sublimation-recondensation method, elements with very different vapor pressures compared to that of Al tend to be non-uniformly incorporated (or even not incorporated) as the crystal grows. The sublimation-recondensation technique uses a solid-vapor-solid transition at a temperature of approximately 2300° C. In comparison, a liquid-solid or a solid-liquid-solid transition from a molten phase including AlN may provide higher growth rates. One of the growth-rate limiting factors in the sublimation-recondensation method is the fact that the dissociation energy of nitrogen gas ($N_2$) is 9.75 electron volts (eV), and most of the nitrogen present in the vapor is in $N_2$ form. The growth rate from the vapor phase is limited by the incorporation rate of atomic nitrogen (N), which is present in smaller amounts, into the solid AlN. In the liquid phase, most or all of the nitrogen is present as atomic N (and at concentrations approximately $10^4$ times higher than in the vapor phase used in sublimation-recondensation), facilitating higher growth rates of AlN. However, the melting temperature of AlN is in the vicinity of 2750° C., where the dissociation pressure of nitrogen is 8 bars. Thus, a typical pure AlN melt-to-AlN solid transition requires higher temperature and higher gas pressure than the sublimation-recondensation method.

SUMMARY

A technique is provided for forming single-crystal materials from a melt via the utilization of pseudo-binary deep-eutectic systems. Such systems include a liquid phase whose "eutectic" melting temperature is lower than the melting temperature of either of the two pure materials in the pseudo-binary solution. As utilized herein, "pseudo-binary" refers to systems that mimic typical binary solutions of the form A-B, but wherein the A and B species are each compounds of at least two elements or ions. Single crystals of, e.g., AlN, are fabricated at the high growth rates enabled by the use of a liquid starting material (and its concomitant high free N concentration) but at lower temperatures and pressures than those required by the solidification of a pure AlN molten phase. Preferred pseudo-binary systems include those in which the solid solubility of each compound in the other (the "mutual solid solubility") is very low, i.e., less than 5% or even approximately zero. These systems enable single crystals of high purity to be formed from the pseudo-binary melt, as the solidification of one member of the pseudo-binary pair will not incorporate appreciable amounts of the other. Moreover, dopant species may be incorporated into the growing crystal with a high degree of uniformity and at high concentrations.

In one aspect, embodiments of the invention feature a method of forming a crystalline structure including providing a liquid containing AlN at a growth temperature lower than the melting point of AlN and forming solid AlN from the liquid. The quality factor of the liquid may be greater than approximately 0.14. The solid AlN may be single-crystalline, and may be substantially free of oxygen. The growth temperature may be at lest 500° C. lower than the melting point of AlN, and the liquid may include or consist essentially of a mixture of AlN and another compound, e.g., a nitride compound, which itself may include or consist essentially of at least one of Y, B, Sc, Ti, V, Zr, La, Ce, Pr, Nd, Gd, or Hf. The concentration of AlN in the liquid may be greater than 20 mole percent. The nitride compound may include a rare-earth element and may getter oxygen during AlN formation. In an embodiment, source material including polycrystalline AlN having a first oxygen concentration is provided and melted to provide the liquid, and the solid AlN formed from the liquid has a second, lower oxygen concentration. This second oxygen concentration may be less than 100 parts per million by weight.

Embodiments of the invention may include one or more of the following. An ambient pressure of nitrogen may be provided which is larger than the decomposition pressures of both AlN and the nitride compound. The nitrogen pressure may be less than 10 kilo bars. The solid solubility of AlN in the nitride compound and the solid solubility of the nitride compound in AlN may be less than 5%, or even approximately zero. The growth temperature may be less than 50° C. greater than the eutectic temperature of AlN and the nitride compound. The growth rate of the solid AlN may be greater than 0.5 mm/hr. The ambient pressure of nitrogen may be selected so as to control the concentration of nitrogen vacancies in the solid AlN, and may be varied by at least one order of magnitude during AlN formation.

In another aspect, embodiments of the invention feature a method of forming a crystalline structure including providing a rod including polycrystalline AlN, a seed including single-crystal AlN, and a liquid between the rod and the seed that includes or consists essentially of AlN and a nitride compound. The liquid is translated toward the rod and single-crystal AlN is formed on the seed as the liquid translates. Translating the liquid may consume at least a portion of the rod, and the rod, seed, and liquid may be disposed within a crucible. The crucible may include carbon, e.g., at least one of polycrystalline graphite, pyrolitic graphite, or glassy carbon. A heating coil may be provided around the outer surface of the crucible, and translating the heating coil may translate the liquid. The diameter of the single-crystal AlN formed on the seed may be approximately equal to the inner diameter of the crucible. The liquid may be translated at a rate greater than 1 mm/hr. The rod may include a dopant species, at least a portion of which is incorporated into the single-crystal AlN formed on the seed. The dopant species may include or consist essentially of at least one of MgO, BeO, a rare-earth element, B, Be, Li, Mg, Zn, Cd, Fe, Co, Mn, Sc, Ti, or V.

In yet another aspect, embodiments of the invention feature an AlN single crystal with a diameter between 1 cm and 30 cm, as well as an oxygen concentration less than 100 parts per million by weight. The AlN single crystal may include a dopant species, which may be at least one of B, Be, Li, Mg, Zn, Cd, Fe, Co, Mn, Sc, Ti, V, or a rare-earth element. The concentration of the dopant species may be approximately uniform across the thickness of the AlN single crystal, and substantially all of the dopant species may be electrically active and uncompensated.

In an additional aspect, embodiments of the invention feature a method of growing AlN single crystals in which the concentration of nitrogen vacancies is changed by at least one order of magnitude by changing the nitrogen overpressure during growth. The crystal growth rate may be maintained above 0.5 mm/hr.

In another aspect, embodiments of the invention feature a method of forming AlN single crystals in which the absorption peak at a wavelength of approximately 430 nm is changed by at least one order of magnitude by changing the nitrogen overpressure during growth. The crystal growth rate may be maintained above 0.5 mm/hr.

In yet another aspect, embodiments of the invention feature an AlN single crystal including at least one dopant species. The concentration of the dopant species is approximately uniform across the thickness of the AlN single crystal, and substantially all of the dopants are electrically active and uncompensated.

Other aspects of embodiments of the invention include an n-type AlN single crystal having an electron concentration greater than $10^{19}$ cm$^{-3}$ and a p-type AlN single crystal having a hole concentration greater than $10^{15}$ cm$^{-3}$.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1:
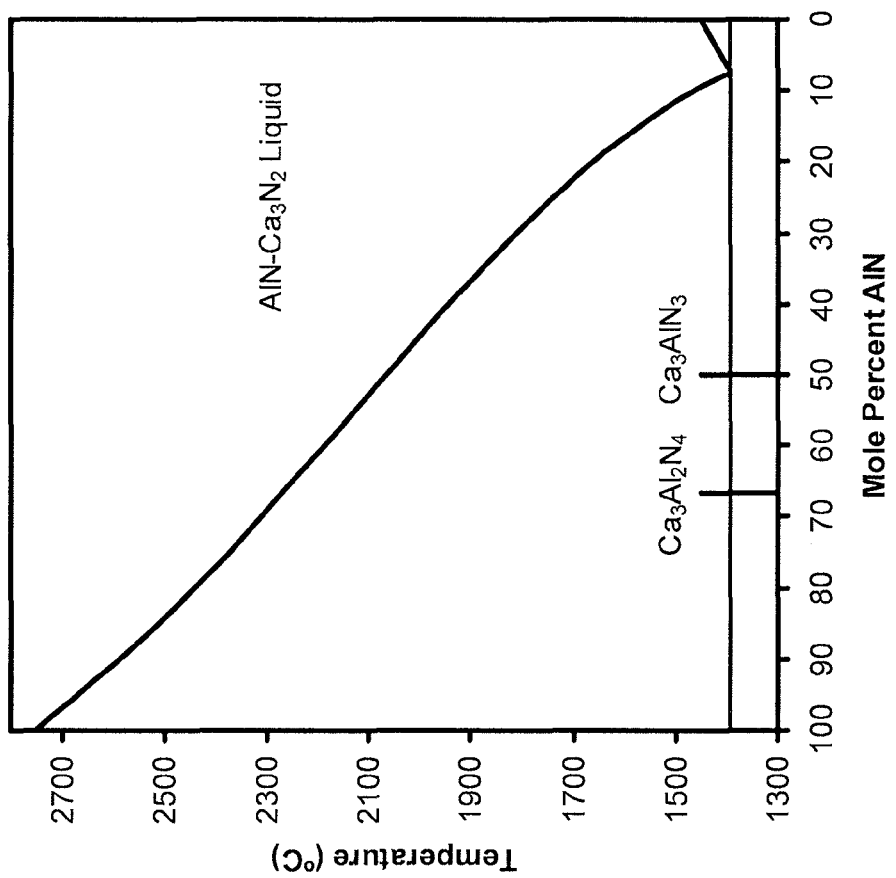
FIG. 1 is a phase diagram of the pseudo-binary system AlN—Ca$_3$N$_2$, an example of a shallow eutectic system with a low quality factor.

The phase diagram of the AlN—Ca$_3$N$_2$ pseudo-binary system is depicted in FIG. 1. The minimum liquidus temperature (i.e., the eutectic temperature) is approximately 1393° C. A quality factor Q may be defined as:

$$Q = \Delta T(K)/T_{lm}(K),$$

where $T_{lm}$ is the lower of the two melting points of the pure compounds in the pseudo-binary and $\Delta T$, the "temperature depression," is the difference between $T_{lm}$ and the eutectic temperature, where all temperatures are in degrees Kelvin. For the AlN—Ca$_3$N$_2$ system shown in FIG. 1, the quality factor Q is approximately 0.033. Herein, we shall term the pseudo-binary systems with $Q \geqq 0.14$ as "deep-eutectic systems," $0.10 \leqq Q \leqq 0.14$ as "intermediate systems," and $0.01 \leqq Q < 0.10$ as "shallow-eutectic systems."

The AlN—Ca$_3$N$_2$ system may be characterized as a shallow-eutectic system. Its low Q value implies that very little AlN is dissolved in the liquid phase at the eutectic temperature. Such shallow-eutectic systems are not useful for the production of commercial-quality, large single crystals. The size of any crystals formed from this system is limited by the low solubility of the AlN in Ca$_3$N$_2$, as well as the low increase in solubility as the temperature is raised above the eutectic temperature of 1393° C. Moreover, attempts to fabricate single crystals from such systems may even result in explosions caused by the high dissociation pressure of Ca$_3$N$_2$ as the temperature is increased over the eutectic point. Many nitride compounds, e.g., Ca$_3$N$_2$ and Mg$_3$N$_2$ form shallow or intermediate pseudo-binary systems with AlN, and hence are not suitable for the fabrication of commercial-quality single-crystal AlN. Such compounds have relatively low melting points, high vapor pressures, and form low Q systems with AlN. Other AlN-containing systems, e.g., AlN—Li$_3$N, do not exhibit single eutectic points and thus form at least one intermediate ternary compound, e.g., one incorporating Al, Li, and N.

Figure 2:
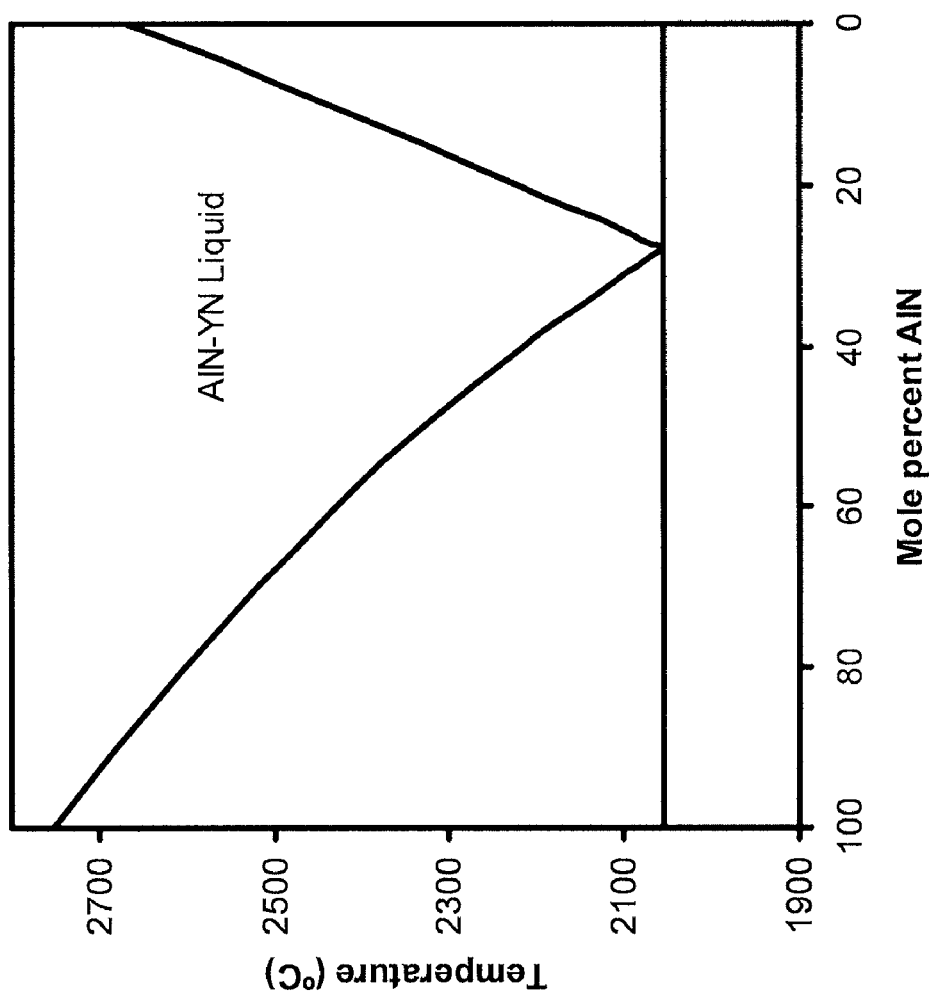
FIG. 2 is a phase diagram of the pseudo-binary system AlN-YN, an example of a deep eutectic system with a high quality factor.

Embodiments of the present invention involve pseudo-binary systems in which the first compound is AlN and the second is a high-melting temperature, low-vapor pressure element or compound. Such systems will have large Qs and will qualify as deep-eutectic systems. For example, AlN and yttrium nitride (YN) form a deep-eutectic pseudo-binary system. The calculated AlN-YN phase diagram is shown in FIG. 2. The melting temperature of YN is 2670° C. while the eutectic temperature is 2055° C. The quality factor for this system is Q=0.21. The eutectic liquid contains 28 mole percent of AlN and 72 mole percent of YN. AlN has a wurtzite structure while YN has a rock salt structure. As FIG. 2 illustrates, the mutual solid solubility of AlN and YN are very small; thus, crystals of AlN or YN grown in accordance with embodiments of the present invention may be quite pure. Single-crystal material formed according to embodiments of the invention may be over approximately 99 mole percent pure, or even greater than approximately 99.9 mole percent pure. As formed according to various embodiments of the invention, single-crystal material, e.g., AlN, may contain less than 1 mole percent, or even less than 0.1 mole percent, of the other material in the pseudo-binary solution, e.g., YN.

In a deep-eutectic pseudo-binary system, there is no fundamental distinction between the solvent and the solute. In growth systems with low Q values (e.g., shallow eutectic systems) the solvent has a much lower melting point than the solute, which facilitates the growth of crystals at a temperature near the melting point of the solvent. However, the solubility of the solute in the solvent is generally quite small, as in the case of the AlN—Ca$_3$N$_2$ system described above. Thus, deep-eutectic systems may advantageously be utilized for the formation of large single crystals of high purity.

A second advantage of high-Q, deep-eutectic systems is that the vapor pressure of the two member compounds at the eutectic temperature is much lower than their vapor pressures at their own, individual melting points. By contrast, in the AlN—Ca$_3$N$_2$ system, the vapor pressure of Al is very low at the growth temperature, but that of Ca is almost the same as that over pure Ca$_3$N$_2$. High vapor pressure may lead to individual components evaporating instead of remaining in the melt, changing the composition of the liquid. This composition change in the melt may lead to non-uniform incorporation of the components in the solid crystal. Table 1 shows several compounds that form deep eutectic systems with AlN, their melting points and the calculated eutectic temperatures and Q values.

A third advantage of deep-eutectic systems is lower power dissipation, and hence, lower cost (both capital and operating costs), of the furnaces compared to that required to grow either pure member of the pseudo-binary from its own pure melt. Moreover, in various embodiments of the invention, the deep-eutectic method provides faster growth rates at lower temperatures than the sublimation-recondensation method for many materials, e.g., AlN.

TABLE 1

| Compound | Melting point (° C.) | Eutectic temperature (° C.) | Mole percent AlN | Weight percent AlN | Q |
|---|---|---|---|---|---|
| BN | 2973 | 2330 | 50 | 62 | 0.140 |
| ScN | 2650 | 2048 | 27 | 25 | 0.210 |
| TiN | 3290 | 2226 | 40 | 42 | 0.174 |
| VN | 2350 | 1936 | 21 | 24 | 0.158 |
| YN | 2670 | 2055 | 28 | 22 | 0.210 |
| ZrN | 2960 | 2163 | 36 | 33 | 0.195 |
| LaN | 2450 | 1995 | 24 | 15 | 0.167 |
| CeN | 2560 | 2034 | 27 | 23 | 0.186 |
| PrN | 2520 | 2020 | 25 | 17 | 0.179 |
| NdN | 2560 | 2034 | 27 | 19 | 0.186 |
| GdN | 2900 | 2146 | 34 | 26 | 0.201 |
| HfN | 3387 | 2270 | 45 | 43 | 0.160 |

As an example, in the AlN-YN deep-eutectic system, it is possible to grow either AlN crystals out of a liquid containing slightly more than 28 mole percent AlN (e.g., 30 mole percent), or YN crystals out of a liquid containing slightly less than 28 mole percent AlN (e.g., 26 mole percent). Of the examples in Table 1, the systems with highest Q are those formed between AlN and gadolinium nitride (GdN), scandium nitride (ScN), and YN.

Gadolinium nitride is cubic with a rock salt crystalline structure and a lattice parameter $a_o$ of 4.999 Å. The melting point of GdN is the highest in the series of rare-earth nitrides, and is estimated at 2900° C. (see A. Vendl, P. Ettmayer, W. Prohaska, High Temp. High Press., Vol. 9, pp. 313-318 (1977), the entire disclosure of which is hereby incorporated by reference). Its calculated eutectic with AlN, assuming no intermediate ternary compounds, is 2146° C. Trivalent rare-earth elements may have some slight solid solubility in AlN in spite of their rather large sizes. Thus, utilizing a melt with compounds such as cerium nitride (CeN), praseodymium nitride (PrN), neodymium nitride (NdN), terbium nitride (TbN), or GdN, which have unfulfilled 4f electron shells (or uranium nitride (UN), which has an unfilled 5f electron shell)

may introduce luminescence centers into the 6.1 eV band gap of AlN. Such centers may prove useful in certain applications.

Scandium nitride has a cubic, rock salt structure. In ScN the Sc-to-N distance is $(a_o/2)=2.256$ Å, where $a_o$ is the cubic lattice parameter. The Sc atoms are octahedrally coordinated to six N atoms. Scandium forms other compounds with N in which the Sc atoms are tetrahedrally coordinated to N, which is the same as the coordination of Al with N in AlN. In AlN, the Al coordination is tetrahedral with an Al-to-N distance of 1.893 Å. The distance ratio (2.121 Å/1.893 Å)=1.12 is sufficiently close to unity that some ScN may be soluble in AlN. The ScN—AlN phase diagram is very similar to the one in FIG. 2. It has a eutectic temperature of 2048° C. at a composition of 27 mole percent AlN and 73 mole percent ScN. The mutual solid solubilities are no more than a few mole percent and may even be approximately zero, as shown in FIG. 2. No Sc—Al—N ternary compounds are known. Cooling a ScN—AlN melt containing between 100% AlN and 28% AlN will precipitate nearly pure AlN crystals before it solidifies at 2048° C.

The pseudo-binary system YN—AlN has a Q-factor of 0.210. Several studies have shown that there are no intermediate compounds in the YN—AlN pseudo binary phase diagram. See, e.g., U.S. Pat. No. 4,547,471 to Huseby et al., and W. Y. Sun, Z. K. Huang, T. Y. Tien, and T. S. Yen, Mater. Letters, Vol. 3-4, pp. 67-99 (1991), the entire disclosures of which are hereby incorporated by reference. Huseby et al. found no intermediate compounds at 1900° C. to 2000° C. while Sun et al. found none at 1850° C. The estimated tetrahedral Y-to-N distance is 2.34 Å for Y dissolved in AlN. This is 24% larger than that of AlN, so the solid solubility of YN in AlN, and vice-versa, will be quite small, i.e., less than a few mole percent, or even approximately zero. Thus, a useful temperature range for growing AlN crystals from a AlN-YN melt is 2300° C. to 2055° C. with an AlN content of the melt of 47 to 28 mole percent.

Figure 3:
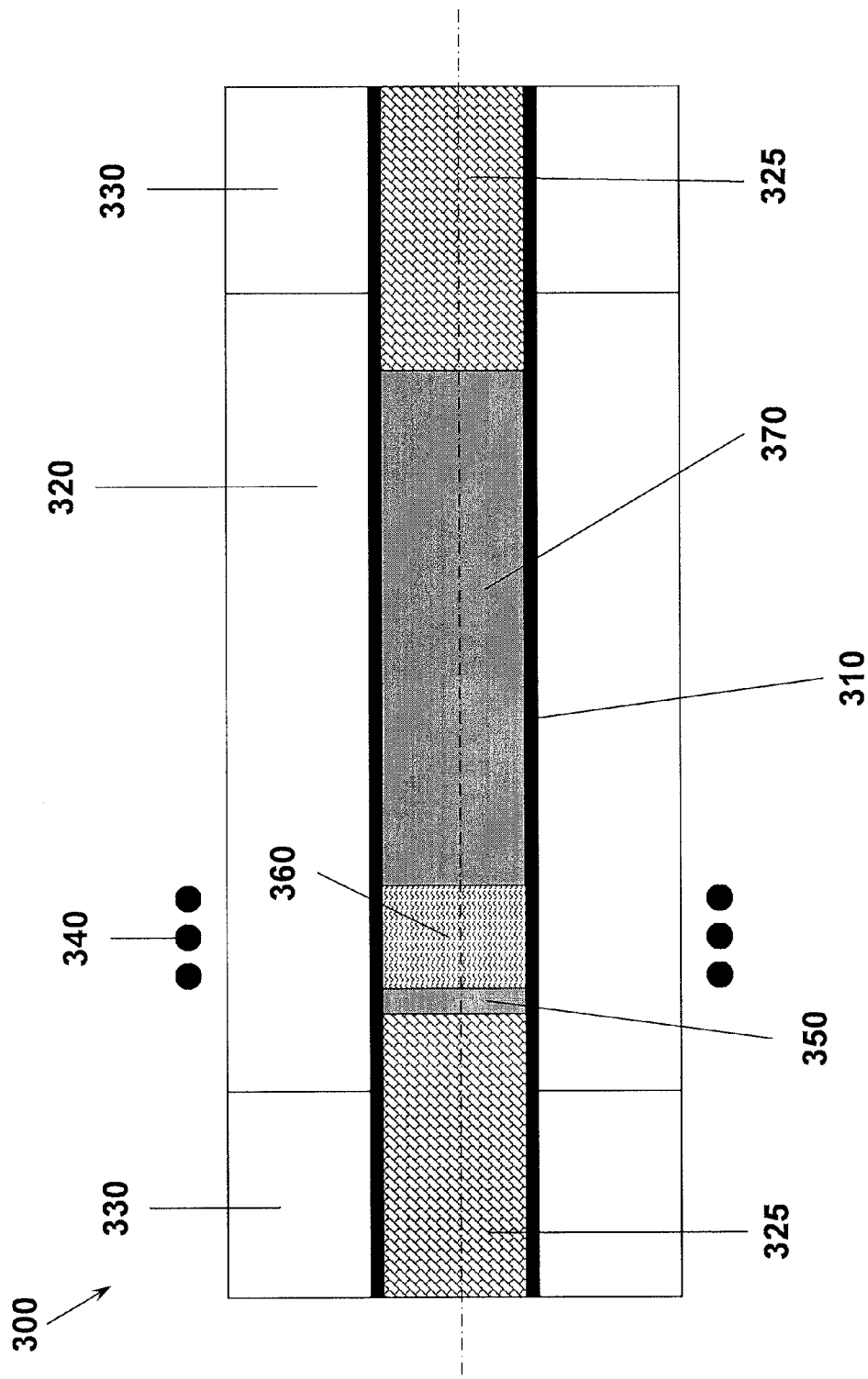
FIG. 3 is a cross-sectional schematic of a growth apparatus for fabricating single-crystal materials.

FIG. 3 depicts a growth apparatus 300 for the fabrication of single-crystal materials in accordance with embodiments of the invention. Growth apparatus 300 includes a tube furnace 310, which includes or consists essentially of carbon or another high temperature-resistant material, e.g., polycrystalline graphite, pyrolitic graphite, or glassy carbon. Tube furnace 310 is surrounded by insulation 320, which includes or consists essentially of at least one refractory material, e.g., reticulated, low-density graphite. The two ends of tube furnace 310 are sealed with plugs 325, which may include or consist essentially of graphite, thus sealing growth apparatus 300. Electrodes 330 are present at either end of tube furnace 310, and include or consist essentially of at least one conductive material, e.g., a metal such as copper. Electrodes 330 may be externally cooled by, e.g. water or air cooling, and are connected to a power source (not shown), e.g., a 60 Hertz-cycle alternating current power source. Induction coil 340 surrounds a portion of tube furnace 310 and insulation 320 and is translatable along the length of tube furnace 310. Induction coil 340 provides a region of localized heating (and concomitant melting of any material present within tube furnace 310) within a portion of tube furnace 310 approximately coextensive with the width of induction coil 340.

Within tube furnace 310 are placed seed 350, eutectic material 360, and source material 370, and tube furnace 310 effectively acts as a crucible for the crystal growth process described below. In an embodiment, tube furnace 310 includes or consists essentially of one or more materials not present in seed 350, eutectic material 360, and source material 370. In a further embodiment, tube furnace 310 is chemically inert with respect to the materials present in seed 350, eutectic material 360, and source material 370. Seed 350 is a single crystal, e.g., a wafer, of the desired final single-crystal material, e.g., a nitride material such as AlN. Source material 370 is a rod including or consisting essentially of the material of seed 350. In an embodiment, source material 370 is an AlN polycrystalline ceramic having a density approximately equal to (or within a few percent of) the theoretical density of AlN. Eutectic material 360 includes or consists essentially of a solid mixture of two materials, of which one is the material of seed 350. The second material present in eutectic material 360 is, e.g., a material forming a deep eutectic with the material of seed 350. In an embodiment, eutectic material 360 includes or consists essentially of a mixture of AlN and another nitride material, e.g., YN, BN, ScN, TiN, VN, ZrN, LaN, CeN, PrN, NdN, GdN, or HfN. In a preferred embodiment, eutectic material 360 includes or consists essentially of a mixture of AlN and YN. In a further embodiment, the second material in eutectic material 360 is a non-salt, a non-organic, and/or a non-amine material. In yet another embodiment, eutectic material 360 is substantially free of alkali metals, alkali earth metals, and compounds including alkali metals and/or alkali earth metals.

The two materials in eutectic material 360 are preferably intermixed and present in relative concentrations approximately corresponding to their eutectic composition. In order to fabricate a suitable eutectic material 360, high-purity polycrystalline starting materials corresponding to the two materials of eutectic material 360, e.g., AlN and YN, are mixed in a graphite crucible in relative concentrations corresponding to their eutectic composition (in the AlN-YN example, 28 mole percent AlN and 72 mole percent YN) and heated to a temperature higher than that of the eutectic point (approximately 2055° C. for AlN-YN) to form a molten phase. In various embodiments, this molten phase preferably contains at least 20 mole percent of each of the starting materials, and even more preferably approximately 50 mole percent of each of the starting materials. The starting materials are melted in the graphite crucible under a $N_2$ pressure sufficient to prevent decomposition of the starting materials and/or reactions between the starting materials and the graphite crucible. The molten phase is then cooled rapidly, i.e., quenched, resulting in a solid, fine-scale intermixture of the two solid starting materials, i.e., eutectic material 360. Before eutectic material 360 is placed in tube furnace 310, it may be machined to any desired shape, e.g., a cylinder having a diameter of approximately 5 cm and a length of approximately 1.5 cm.

In order to form a desired single-crystal material, the temperature within tube furnace 310 is raised from room temperature to approximately 50° C. below the eutectic temperature of eutectic material 360 by, e.g., 60 Hertz-cycle alternating current heating. Induction coil 340 then heats eutectic material 360 to a temperature approximately 30° C. to approximately 50° C. above its eutectic melting point, whereupon the molten eutectic material 360 may dissolve small amounts of seed 350 and source material 370 proximate eutectic material 360. Thus, in an embodiment, the composition of molten eutectic material 360 is richer in the material of seed 350 than the eutectic composition. Induction coil 340 is then translated along the length of tube furnace 310 away from seed 350, correspondingly translating the molten zone corresponding to eutectic material 360. As the molten zone translates through source material 370, single-crystal material corresponding to the material of seed 350, e.g., a nitride material such as AlN, is grown on seed 350. The single-crystal material may be approximately or even exactly stoichiometric in composition. The growth rate of this material corresponds to the translation rate of induction coil 340, which may be between approximately 0.01 mm/hr and approximately 100 cm/hr. In a preferred embodiment, the growth rate is greater than approximately 0.5 mm/hr or even greater than 10 cm/hr. During crystal growth, a pressure of $N_2$ is maintained within tube furnace 310 that is sufficient to prevent the decomposition of the materials of seed 350, eutectic material 360, and source material 370. In an embodiment, the $N_2$ pressure is between approximately 0.01 bar and 1000 bars, and preferably between approximately 1 bar and 10 bars. Once induction coil 340 has been translated the entire length of source material 370 within tube furnace 310, it is shut down and growth apparatus 300 is cooled down to room temperature. Seed 350 has effectively grown in length, thus forming an ingot of the desired single-crystal material. In an embodiment, the single-crystal material has a diameter approximately equal to the inner diameter of tube furnace 310. This diameter may be between approximately 1 cm and approximately 30 cm. The single-crystal material may be substantially free of oxygen and/or carbon impurities. In an embodiment, oxygen and/or carbon may be present in the single-crystal material at concentrations less than approximately $10^{19}$ cm$^{-3}$, or even less than $10^{17}$ cm$^{-3}$. Wafers of the single-crystal material may be fabricated from the ingot by, e.g., cutting with a wire saw. Such wafers may be subsequently polished and/or may be platforms for subsequent epitaxial growth of semiconductor layers.

In an embodiment, the ingot of single-crystal material has a composition of approximately 100% of the material of seed 350. In other embodiments, the ingot of single-crystal material contains small amounts, e.g., 0.01-5 mole percent, of the second material of eutectic material 360. This amount of incorporated second material may be increased by increasing the translation rate of induction coil 340 during crystal growth, and may even be non-uniform along the length of the final single-crystal ingot. In some embodiments, the ingot of single-crystal material is substantially free of the second material of eutectic material 360, obviating the need for post-formation etching or washing in water and/or acid solutions to remove such material.

In an embodiment, due to high radial temperature uniformity during formation, single-crystal materials formed as described herein may have large diameters, e.g., greater than 100 mm, and be substantially free of cracks. Single crystals formed from a single seed 350 may have large diameters and be substantially free of any grain boundaries, tilt boundaries, stacking faults, or other defects which often arise when single crystals are formed from a plurality of smaller seeds.

Growth of Doped Crystals

In various embodiments, source material 370 may additionally include at least one dopant species (i.e., a dopant element or compound), e.g., magnesium oxide (MgO), beryllium oxide (BeO), rare-earth elements, magnesium (Mg), lithium (Li), beryllium (Be), zinc (Zn), cadmium (Cd), manganese (Mn), iron (Fe), chromium (Cr), titanium (Ti), vanadium (V), and/or boron (B). During crystal growth, the dopant species (and/or one of its constituent elements) is incorporated into the growing single crystal. In the case of a eutectic material 360 including AlN and YN and an MgO dopant species, growth of the single-crystal AlN will include an additional chemical reaction between the YN and the MgO in which the YN will getter the oxygen and the Mg will be incorporated in the AlN single crystal. The chemical reaction is:

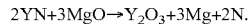

$2YN+3MgO \rightarrow Y_2O_3+3Mg+2N$.

Embodiments of the invention are also suitable for production of single crystals uniformly doped with electrically active impurities, i.e., dopants. Uniformly doped single crystals may have a concentration of a dopant species that is approximately constant, to within a factor of approximately 5, across their thicknesses. In an embodiment, the dopant concentration is approximately constant across the thickness. In another embodiment, the electrically active impurities are substantially uncompensated by other impurities or point defects such as vacancies. Single-crystal materials grown according to embodiments of the present invention may be n-type doped at levels greater than approximately $1 \times 10^{18}$ cm$^{-3}$, and even at levels greater than approximately $1 \times 10^{20}$ cm$^{-3}$. Single-crystal materials grown according to embodiments of the present invention may be p-type doped at levels greater than approximately $1 \times 10^{15}$ cm$^{-3}$, and even at levels greater than approximately $1 \times 10^{18}$ cm$^{-3}$. Carrier concentrations exhibited by the single-crystal materials may be greater than approximately $1 \times 10^{18}$ cm$^{-3}$, or even greater than approximately $1 \times 10^{20}$ cm$^{-3}$, and may be approximately equal to the dopant concentration in the single-crystal material (i.e., the dopants may be approximately all electrically active and uncompensated).

Because the crystal growth proceeds from the liquid phase, the vapor pressure of the dopant elements is greatly reduced compared to their vapor pressures over their simple nitride compounds. In order to keep even high vapor pressure dopant species in solution, the $N_2$ pressure during crystal growth is preferably maintained at 0.1 to 100 bars, and, in some embodiments, up to 1 kbar. Advantageously, the application of a $N_2$ overpressure may also be used to reduce the concentration of N vacancies within the single-crystal material without affecting its growth rate since the growth rate is basically insensitive to the $N_2$ pressure over a wide range of $N_2$ overpressures. This is not the case for growth from the vapor phase, in which typically the $N_2$ pressure must be maintained in a range of 1 to 2 bars (depending on the source-seed distance) to obtain maximum growth rate, with the growth rate falling off rapidly at both high and low $N_2$ pressures. This control over N vacancies enables control over the stoichiometry of the single-crystal material during growth. The application of a high $N_2$ pressure may be used to reduce the number of N vacancies generated within the single-crystal material. In the case of growth of a single-crystal material including or consisting essentially of AlN, a lower $N_2$ pressure may be utilized during growth, thus generating an excess of N vacancies. These N vacancies may combine with Al vacancies, thus reducing their number, by combining with them to form an inactive void in the single-crystal material. In an embodiment, the $N_2$ pressure is varied by at least one order of magnitude while maintaining a high growth rate of the single-crystal material (e.g., greater than approximately 0.5 mm/hr). The high growth rate may be maintained even if all other growth parameters are kept constant as the $N_2$ pressure is varied. The resulting concentration of N vacancies may affect the optical absorption of the single-crystal material, specifically at a wavelength of approximately 430 nm for the case of AlN.

Oxygen Gettering

Embodiments of the present invention may be utilized to advantageously getter oxygen impurities from the desired single-crystal material. For the case of a eutectic material 360 including AlN and YN, the YN will getter oxygen during growth of single-crystal AlN by the reaction $YN+\frac{1}{2}Al_2O_3 \rightarrow \frac{1}{2}Y_2O_3+AlN$. At the eutectic temperature (in this example 2055° C.), the Gibbs free energy difference (ΔG) for this reaction to form one mole of AlN is −148 kJ/mol, so $Y_2O_3$ is more stable than $Al_2O_3$. During the deep-eutectic growth of AlN, the $Y_2O_3$ remains in solution in the liquid YN—AlN eutectic material 360 and the newly grown AlN single crystal has a lower oxygen concentration than that of source material 370. The lower limit in the final oxygen concentration in the single-crystal material may be determined by the purity of the other compound in eutectic material 360. Other nitrides possess favorable ΔG values and may therefore beneficially getter oxygen during AlN growth from the melt, for example, ScN (ΔG=−126 kJ/mol), LaN (ΔG=−104 kJ/mol), and GdN (ΔG=−94 kJ/mol). In contrast, nitrides such as TiN (ΔG=95 kJ/mol) and ZrN (ΔG=13 kJ/mol) may not getter oxygen due to unfavorable ΔG values.

Other Methods of Growth from the Melt

Liquid phase epitaxy: one common use of growth from a melt is liquid phase epitaxy. In this process, a crystalline wafer, e.g., an AlN wafer, is temporarily dipped into a bath that is critically saturated with the material of the wafer, e.g., either pure or doped AlN. Then the bath temperature is lowered a few degrees and a thin, new layer of pure or doped material is deposited on the wafer. The wafer is then removed from the bath and allowed to cool. Coating layers of 10 to 100 μm thick may be produced by this method. The deep-eutectic material systems described herein may be used in this manner at temperatures slightly above their eutectic temperatures.

Horizontal-boat-zone-melting (HBZM): in this method, two rods of solid material, e.g., AlN, are connected through a hot, molten zone of a liquid pseudo-binary phase held between them. See W. D. Lawson and S. Nielsen, "Preparation of Single Crystals", Academic Press, New York, 1958, pp. 18-20, the entire disclosure of which is hereby incorporated by reference. One rod is a single crystal; the other is a polycrystalline source material. As the molten zone is moved the crystal grows incorporating material from the polycrystalline rod. The deep-eutectic material systems described herein may also be utilized in HBZM to fabricate single crystals of, e.g., AlN.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of forming a crystalline structure, the method comprising:
   providing, at a growth temperature, a liquid (i) consisting essentially of a mixture of AlN and a non-AlN nitride compound, and (ii) having a quality factor greater than approximately 0.14; and
   forming solid AlN from the liquid, the solid AlN having an oxygen concentration less than 100 parts per million by weight,
   wherein (i) the quality factor is defined as $Q=\Delta T(K)/T_{lm}(K)$, Q being the quality factor, $T_{lm}$ being the lower of the melting points of AlN and the non-AlN nitride compound in degrees Kelvin, and ΔT being the difference between $T_{lm}$ and the minimum liquidus temperature of the pseudo-binary system formed by AlN and the non-AlN nitride compound, and (ii) the growth temperature is lower than a melting point of AlN.

2. The method of claim 1, wherein the growth temperature is at least 500° C. lower than the melting point of AlN.

3. The method of claim 1, wherein the non-AlN nitride compound comprises at least one of Y, B, Sc, Ti, V, Zr, La, Hf, or a rare-earth element.

4. The method of claim 1, wherein a concentration of AlN in the liquid is greater than 20 mole percent.

5. The method of claim 1, further comprising:
   providing source material comprising polycrystalline AlN having a first oxygen concentration,
   wherein providing the liquid comprises melting at least a portion of the source material, and the solid AlN comprises a second oxygen concentration lower than the first oxygen concentration.

6. The method of claim 1, further comprising providing an ambient pressure of nitrogen larger than both a decomposition pressure of AlN and a decomposition pressure of the non-AlN nitride compound.

7. The method of claim 1, wherein a solid solubility of AlN in the non-AlN nitride compound and a solid solubility of the non-AlN nitride compound in AlN are both less than 5%.

8. The method of claim 7, wherein the solid solubility of AlN in the non-AlN nitride compound and the solid solubility of the non-AlN nitride compound in AlN are both approximately zero.

9. The method of claim 1, wherein the growth temperature is less than 50° C. greater than a eutectic temperature of AlN and the non-AlN nitride compound.

10. The method of claim 1, wherein a growth rate of the solid AlN is greater than 0.5 mm/hr.

11. The method of claim 10, further comprising selecting an ambient pressure of nitrogen, thereby controlling a concentration of nitrogen vacancies in the solid AlN.

12. The method of claim 11, wherein the ambient pressure of nitrogen is varied by at least one order of magnitude while forming solid AlN.

13. The method of claim 1, further comprising:
   providing a rod comprising AlN and the non-AlN nitride compound at approximately their eutectic composition;
   providing a seed comprising single-crystal AlN,
   wherein (i) forming the liquid comprising AlN and the non-AlN nitride compound comprises melting a portion of the rod, and (ii) the liquid comprising AlN and the non-AlN nitride compound is disposed between an end of the rod and the seed; and
   translating the liquid toward the rod,
   whereby the solid AlN is formed on the seed as the liquid translates.

14. The method of claim 13, wherein translating the liquid consumes at least a portion of the rod.

15. The method of claim 13, further comprising providing a crucible in which the rod, the seed, and the liquid are disposed, the crucible comprising at least one of polycrystalline graphite, pyrolitic graphite, or glassy carbon.

16. The method of claim 15, further comprising providing a heating coil surrounding an outer surface of the crucible, wherein translating the heating coil translates the liquid.

17. The method of claim 15, wherein a diameter of the solid AlN formed on the seed is approximately equal to an inside diameter of the crucible.

18. The method of claim 13, wherein the liquid is translated at a rate of greater than 1 mm/hr.

19. The method of claim 13, wherein the rod comprises a dopant species, and at least a portion of the dopant species is incorporated into the solid AlN formed on the seed.

20. The method of claim 19, wherein the dopant species comprises at least one of MgO, BeO, a rare-earth element, B, Be, Li, Mg, Zn, Cd, Fe, Co, Mn, Sc, Ti, or V.

21. The method of claim 1, wherein the solid AlN is single-crystalline.

22. The method of claim 13, wherein the solid AlN is single-crystalline.

23. The method of claim 1, wherein the growth temperature is less than 50° C. higher than the minimum liquidus temperature of the pseudo-binary system formed by AlN and the non-AlN nitride compound.

* * * * *